US006228543B1

(12) United States Patent
Mizuno et al.

(10) Patent No.: US 6,228,543 B1
(45) Date of Patent: May 8, 2001

(54) THERMAL TRANSFER WITH A PLASTICIZER-CONTAINING TRANSFER LAYER

(75) Inventors: Kazuhiko Mizuno, Hachiouji (JP); John S. Staral, Woodbury; Richard J. Pokorny, Maplewood, both of MN (US)

(73) Assignee: 3M Innovative Properties Company, St. Paul, MN (US)

(*) Notice: Subject to any disclaimer, the term of this patent is extended or adjusted under 35 U.S.C. 154(b) by 0 days.

(21) Appl. No.: 09/392,386

(22) Filed: Sep. 9, 1999

(51) Int. Cl.[7] .............................. G03F 7/34; G03F 7/038; G03C 1/31

(52) U.S. Cl. ......................... 430/17; 430/200; 430/270.1; 430/271.1; 430/280.1; 430/281.1; 430/964

(58) Field of Search ..................................... 430/200, 964, 430/17, 270.1, 281.1, 280.1, 271.1

(56) References Cited

U.S. PATENT DOCUMENTS

| | | | |
|---|---|---|---|
| 4,044,044 | 8/1977 | Saito . | |
| 4,055,613 | 10/1977 | Kapral . | |
| 4,438,190 | 3/1984 | Ishimaru et al. ...................... | 430/281 |
| 4,600,628 | 7/1986 | Ishii et al. ............................ | 428/216 |
| 4,833,124 | 5/1989 | Lum ..................................... | 503/227 |

(List continued on next page.)

FOREIGN PATENT DOCUMENTS

| | | |
|---|---|---|
| 0 321 923 B1 | 7/1992 | (EP) . |
| 0 751 008 A1 | 1/1997 | (EP) . |
| 0 780 240 | 6/1997 | (EP) . |
| 0 798 128 | 10/1997 | (EP) . |
| 0 839 668 | 5/1998 | (EP) . |
| 0 844 079 A1 | 5/1998 | (EP) . |
| 0 568 993 B1 | 8/1998 | (EP) . |
| 58-119897 | 7/1983 | (JP) . |
| 59-076295 | 5/1984 | (JP) . |
| 1-20157 | 8/1990 | (JP) . |
| 8-38629 | 3/1997 | (JP) . |
| 332930 | 12/1998 | (JP) . |
| 11-14979 | 1/1999 | (JP) . |
| 10-87779 | 1/2000 | (JP) . |
| WO 95/13195 | 5/1995 | (WO) . |
| WO 97/15173 | 4/1997 | (WO) . |
| WO 98/03346 | 1/1998 | (WO) . |

OTHER PUBLICATIONS

ASTM E1356 and as determined using the general procedures and practices provided in ASTM E1356 (Standard Test Method for Assignment of the Glass Transition Temperatures by Differential Scanning Calorimetry or Differential Thermal Analysis).

TA Instruments' technical publications Modulated DSC™ Compendium Basic Theory & Experimental Considerations (TA–210).

TA Instruments' technical publications Modulated DSC™ Theory (TA–211B).

TA Instruments' technical publications Choosing Conditions in Modulated DSC® (TN–45B).

(List continued on next page.)

*Primary Examiner*—Richard L. Schilling
(74) *Attorney, Agent, or Firm*—Robert J. Pechman

(57) ABSTRACT

A plasticizer-containing layer can be used in a thermal transfer element to facilitate transfer to a receptor for the formation of a variety of articles. In one method, a receptor is brought into contact with a thermal transfer element that includes a transfer unit having at least one layer with a binder composition and a plasticizer. A portion of the transfer unit is thermally transferred to the receptor. This thermal transfer can be accomplished using, for example, a thermal print head or radiative (e.g., light or laser) thermal transfer. After transfer, the binder composition and the plasticizer (in the portion of the transfer unit that is transferred to the receptor) are reactively coupled.

30 Claims, 1 Drawing Sheet

U.S. PATENT DOCUMENTS

| | | | |
|---|---|---|---|
| 4,912,083 | 3/1990 | Chapman et al. | 430/201 |
| 4,921,921 | 5/1990 | Ritter | 526/195 |
| 4,940,640 | 7/1990 | MacDiarmid . | |
| 4,942,141 | 7/1990 | DeBoer et al. | 430/201 |
| 4,948,776 | 8/1990 | Evans et al. | 430/201 |
| 4,948,778 | 8/1990 | DeBoer | 430/201 |
| 4,950,639 | 8/1990 | DeBoer et al. | 430/201 |
| 4,952,552 | 8/1990 | Chapman et al. | 430/201 |
| 5,023,229 | 6/1991 | Evans et al. | 430/201 |
| 5,024,990 | 6/1991 | Chapman et al. | 430/201 |
| 5,089,372 | 2/1992 | Kirihata et al. | 430/167 |
| 5,156,938 | 10/1992 | Foley et al. | 430/201 |
| 5,166,024 | 11/1992 | Bugner et al. | 430/70 |
| 5,171,650 | 12/1992 | Ellis et al. | 430/201 |
| 5,244,770 | 9/1993 | DeBoer et al. | 430/200 |
| 5,256,506 | 10/1993 | Ellis et al. | 430/201 |
| 5,286,604 | 2/1994 | Simmons, III | 430/944 |
| 5,340,699 | 8/1994 | Haley et al. | 430/302 |
| 5,351,617 | 10/1994 | Williams et al. | 101/467 |
| 5,360,694 | 11/1994 | Thien et al. | 430/200 |
| 5,387,496 | 2/1995 | DeBoer | 430/201 |
| 5,395,729 | 3/1995 | Reardon et al. | 430/200 |
| 5,401,607 | 3/1995 | Takiff et al. | 430/253 |
| 5,501,938 | 3/1996 | Ellis et al. | 430/201 |
| 5,521,035 | 5/1996 | Wolk et al. | 430/200 |
| 5,534,905 | 7/1996 | Takahashi et al. | 347/171 |
| 5,580,693 | 12/1996 | Nakajima et al. | 430/200 |
| 5,593,808 | 1/1997 | Ellis | 430/261 |
| 5,605,780 | 2/1997 | Burberry et al. | 430/278.1 |
| 5,612,165 | 3/1997 | Ellis | 430/201 |
| 5,622,795 | 4/1997 | Ellis | 430/201 |
| 5,685,939 | 11/1997 | Wolk et al. | 156/234 |
| 5,691,114 | 11/1997 | Burberry et al. | 430/302 |
| 5,693,446 | 12/1997 | Staral et al. | 430/201 |
| 5,710,097 | 1/1998 | Staral et al. | 430/200 |
| 5,725,989 * | 3/1998 | Chang et al. | 430/200 |
| 5,739,189 | 4/1998 | Lorenz et al. | 524/300 |
| 5,766,819 | 6/1998 | Blanchet-Fincher | 430/200 |
| 5,863,704 | 1/1999 | Sakurai et al. | 430/271.1 |
| 5,935,902 * | 8/1999 | Imamura | 430/200 |
| 6,051,318 | 4/2000 | Kwon | 430/200 |

OTHER PUBLICATIONS

TA Instruments' technical publications Enhanced DSC Glass Transition Measurements (TN–7).

TA Instruments' technical publications Characterization of the Effect of Water as a Plasticizer on Lactose by MDSC® (TS–45).

*Polymer Handbook*, J. Brandrup, ed., pp. VII 519–557 (1989).

Beilo, K.A. et al., *J. Chem. Soc., Chem. Commun.*, 1993, 452–454 (1993).

* cited by examiner

THERMAL TRANSFER WITH A PLASTICIZER-CONTAINING TRANSFER LAYER

FIELD OF THE INVENTION

This invention relates to thermal transfer elements and methods of transferring layers from the thermal transfer elements, as well as the articles formed by these methods. In particular, the invention relates to thermal transfer elements having plasticizer-containing transfer layers and methods of transferring layers from the thermal transfer elements, as well as the articles formed by these methods.

BACKGROUND OF THE INVENTION

The thermal transfer of layers from a thermal transfer element to a receptor has been suggested for the preparation of a variety of products. Such products include, for example, color filters, spacers, black matrix layers, polarizers, printed circuit boards, displays (for example, liquid crystal and emissive displays), polarizers, z-axis conductors, and other items that can be formed by thermal transfer including, for example, those described in U.S. Pat. Nos. 5,156,938; 5,171,650; 5,244,770; 5,256,506; 5,387,496; 5,501,938; 5,521,035; 5,593,808; 5,605,780; 5,612,165; 5,622,795; 5,685,939; 5,691,114; 5,693,446; and 5,710,097 and PCT Patent Applications Nos. 98/03346 and 97/15173, incorporated herein by reference.

For many of these products, resolution and edge sharpness are important factors in the manufacture of the product. Another factor is the size of the transferred portion of the thermal transfer element for a given amount of thermal energy. As an example, when lines or other shapes are transferred, the linewidth or diameter of the shape depends on the size of the resistive element or light beam used to pattern the thermal transfer element. The linewidth or diameter also depends on the ability of the thermal transfer element to transfer energy. Near the edges of the resistive element or light beam, the energy provided to the thermal transfer element may be reduced. Thermal transfer elements with better thermal conduction, less thermal loss, more sensitive transfer coatings, and/or better light-to-heat conversion typically produce larger linewidths or diameters. Thus, the linewidth or diameter can be a reflection of the efficiency of the thermal transfer element in performing the thermal transfer function. To address these issues of the thermal transfer process, new methods of thermal transfer and new thermal transfer element configurations are developed.

SUMMARY OF THE INVENTION

Generally, the present invention relates to thermal transfer elements having plasticizer-containing transfer layers and methods of transferring layers from the thermal transfer elements, as well as the articles formed by these methods. One embodiment is a method of making an article. In this method, a receptor is brought into contact with a thermal transfer element that includes a transfer unit having at least one layer with a binder composition and a plasticizer. A portion of the transfer unit is thermally transferred to the receptor. This thermal transfer can be accomplished by, for example, using a thermal print head or radiative (e.g., light or laser) thermal transfer. After transfer, the binder composition and the plasticizer (in the portion of the transfer unit that is transferred to the receptor) is reactively coupled.

Another embodiment is a thermal transfer element that includes a substrate and a transfer unit. The transfer unit includes at least one layer having a binder composition and a plasticizer that are capable of co-reacting after transfer of a portion of the transfer unit to a receptor.

Yet another embodiment is an article that includes a substrate and a thermally transferred layer. The thermally transferred layer includes a binder composition and a plasticizer that have been co-reacted subsequent to the transfer of the thermally transferred layer from a thermal transfer element.

In these embodiments, the plasticizer is typically selected to facilitate transfer to a receptor. For example, a plasticizer or plasticizers having a glass transition temperature of no more than 25° C. can be chosen. As another example, a plasticizer of plasticizers can be chosen to give the plasticizer-containing layer a glass transition temperature that is at least 40° C. less than the same layer without the plasticizer.

The above summary of the present invention is not intended to describe each disclosed embodiment or every implementation of the present invention. The Figures and the detailed description which follow more particularly exemplify these embodiments.

BRIEF DESCRIPTION OF THE DRAWINGS

The invention may be more completely understood in consideration of the following detailed description of various embodiments of the invention in connection with the accompanying drawings, in which.

Figure 1:
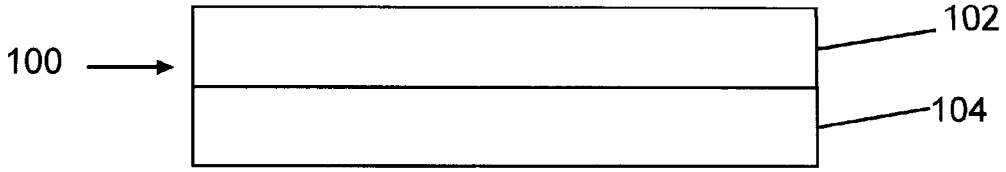
FIG. 1 is a cross-sectional view of one embodiment of a thermal transfer element containing a transfer unit, according to the invention.

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the spirit and scope of the invention.

DETAILED DESCRIPTION OF THE PREFERRED EMBODIMENT

The present invention is believed to be applicable to thermal transfer elements for transferring layers to a receptor, as well as methods for transferring the layers and articles made using the thermal transfer elements. In particular, the present invention is directed to thermal transfer elements with a plasticizer-containing transfer layer, as well as methods for transferring the transfer layers and articles made using the thermal transfer elements. While the present invention is not so limited, an appreciation of various aspects of the invention will be gained through a discussion of the examples provided below.

The use of the term "(meth)acryl" in a chemical name refers to both compounds with acrylic functional groups and compounds with methacrylic functional groups.

The thermal transfer element typically contains at least a donor substrate and a transfer unit that includes at least one plasticizer-containing layer. In operation, a portion of the transfer unit is transferred from the thermal transfer element and the donor substrate to a receptor. FIG. 1 illustrates a thermal transfer element 100 with a donor substrate 102 and a transfer unit 104 including a plasticizer-containing layer. Other layers that can be incorporated in the thermal transfer element include, for example, a light-to-heat conversion (LTHC) layer, an interlayer, and a release layer. Each of these layers is discussed in detail below. Any of these layers can be formed on the donor substrate and/or previously formed layers of the thermal transfer element using a variety of techniques which may depend, at least in part, on the nature of the materials used for the layers. Suitable techniques for forming the layers include, for example, chemical and physical vapor deposition, sputtering, spin coating, roll coating, and other film coating methods.

Transfer Unit

The transfer unit includes all of the layers that can be transferred from the thermal transfer element. The transfer unit can have a single layer or multiple layers. At least one of these layers is a plasticizer-containing layer. At least one plasticizer-containing layer is typically positioned within the thermal transfer element to form an exterior surface of the transfer unit so that the plasticizer-containing layer is brought into contact with the receptor during transfer. The remainder of the layers of the transfer unit are typically positioned between the exterior plasticizer-containing layer and the substrate. Additional layers of the transfer unit can be formed using a variety of materials and configurations, including those described, for example, in U.S. Pat. Nos. 5,156,938; 5,171,650; 5,244,770; 5,256,506; 5,387,496; 5,501,938; 5,521,035; 5,593,808; 5,605,780; 5,612,165; 5,622,795; 5,685,939; 5,691,114; 5,693,446; and 5,710,097, incorporated herein by reference.

The plasticizer-containing layer of the transfer unit includes at least a binder composition and a plasticizer. The addition of plasticizer can reduce the softening temperature and/or viscosity of the binder composition to facilitate the transfer of the transfer unit to the receptor. Alternatively or additionally, the addition of plasticizer can increase the interaction between the binder composition and the receptor surface so that the binder composition adheres better to the receptor surface.

The binder composition and plasticizer are selected so that, after transfer, the binder composition and plasticizer of the transferred portion of the transfer unit can be co-reacted to bind the plasticizer in the transferred layer. The plasticizer is bound within the transferred layer to prevent or reduce the diffusion of the plasticizer to adjacent layers, devices, elements, or components of an article that includes the transferred layer. In at least some applications, diffusion of the plasticizer out of the transferred layer can harm, damage, or destroy the function of other layers, devices, elements, or components of the article. The plasticizer is bound to the binder composition by, for example, copolymerization or cross-linking of the plasticizer and at least one component of the binder composition.

For example, a thermal transfer element with a plasticizer-containing layer can be used in the formation of an electronic display (e.g., an LCD display). The thermal transfer element could be used to form at least a portion of a component of the display, such as, for example, a color filter, a black matrix, and/or spacers. In this application, the presence of substantial amounts of unbound plasticizer in a thermally transferred layer might harm or damage the function of other portions of the display by, for example, diffusion of the plasticizer. In this instance, binding a substantial portion of the plasticizer with the binder composition of the transferred plasticizer-containing layer can reduce or prevent this harm or damage.

A single plasticizer or a combination of plasticizers can be used. The plasticizer can be a monomeric, oligomeric, or polymeric compound. Suitable plasticizers include compounds that reduce the softening point of the binder composition and have reactive functional groups to bind with the binder composition. Reactive functional groups include, for example, epoxide, carboxylic acid, hydroxyl, ethylenic-unsaturated (e.g., olefinic), vinyl, acrylic, methacrylic, amino, ester, mercapto, labile halo, imino, carbonyl, sulfonic acid, and sulfonic ester functional groups and any functional group that is capable of participating in a Diels-Alder reaction. Examples of suitable plasticizers include epoxides, phosphates (such as, for example, (meth)acryloyloxyalkyl phosphates), polyoxyethylene aryl ethers, esters, glycols and glycol derivatives, glycerol and glycerol derivatives, terpenes and terpene derivatives, and halogenated hydrocarbon compounds having reactive functional groups.

Suitable plasticizers for the plasticizer-containing layer can be selected by a variety of methods. For example, plasticizer(s) can be selected to substantially lower the glass transition temperature of the composition that forms the plasticizer-containing layer as compared to the same composition without the plasticizer(s). For example, a selection of appropriate plasticizer(s) can lower the glass transition temperature of the plasticizer-containing layer by 40° C. or 50° C. or more.

Another method of selecting suitable plasticizer(s) includes using plasticizer(s) that have a glass transition temperature below room temperature (e.g., below about 20° C. or 25° C.). In some instances, plasticizer(s) that are liquids at room temperature are chosen.

The glass transition temperatures ($T_g$) of the corresponding materials and compositions can generally be determined using, for example, differential scanning calorimetry (DSC). The glass transition temperature is typically defined as the respective $T_m$ "midpoint temperatures" (that is, $T_{g=Tm}$) as defined in ASTM E1356 and as determined using the general procedures and practices provided in ASTM E1356 (*Standard Test Method for Assignment of the Glass Transition Temperatures by Differential Scanning Calorimetry or Differential Thermal Analysis*). Because some of the materials and compositions are self-reactive and/or co-reactive, only "first heat" MDSC data is typically employed in the determination of $T_m$ of these materials (that is, step 10.2 in the "Procedure" section of ASTM E1356 should be omitted).

If the $T_m$ "midpoint temperatures" of these materials are not readily obtainable using conventional DSC methods, modulated differential scanning calorimetry (MDSC) methods can be employed to measure $T_m$ in lieu of conventional DSC methods. In these cases, $T_m$ can be determined using MDSC methods according to the general procedures and practices provided in, for example, TA Instruments' technical publications *Modulated DSC™ Compendium Basic Theory & Experimental Considerations, Modulated DSC™ Theory* (*TA*-211*B*), *Choosing Conditions in Modulated DSC®* (*TN*-45*B*), *Enhanced DSC Glass Transition Measurements* (*TN*-7) and *Characterization of the Effect of Water as a Plasticizer on Lactose by MDSC®* (*TS*-45).

In addition to the plasticizer, the plasticizer-containing layer includes a binder composition. The binder composition typically includes one or more binder resins. The binder composition optionally includes other additives such as, for example, dispersing agents, surfactants, stabilizers, crosslinking agents, photocatalysts, photoinitiators, and/or coating aids.

The binder resin of the binder composition gives structure to the layer. The binder composition can include one or more binder resins. Typically, at least one of these binder resins (and, in some embodiments, all of the binder resins) are polymerizable or crosslinkable. A variety of binder resins can be used including, for example, monomeric, oligomeric, and polymeric binder resins. Suitable binder resins for use in the plasticizer-containing layer include film-forming polymers, such as, for example, phenolic resins (e.g., novolak and resole resins), polyvinyl butyral resins, polyvinyl acetates, polyvinyl acetals, polyvinylidene chlorides, polyacrylates, cellulosic ethers and esters, nitrocelluloses, (meth)acrylate polymers and copolymers, epoxy resins, ethylenic-unsaturated resins, polyesters, polysulphones, polyimides, polyamides, polysulphides, and polycarbonates.

Dispersing agents can be used, particularly if some of the components of the layer are non-compatible. Suitable dispersing agents include, for example, vinyl chloride/vinyl acetate copolymers, poly(vinyl acetate)/crotonic acid copolymers, polyurethanes, styrene maleic anhydride half ester resins, (meth)acrylate polymers and copolymers, poly (vinyl acetals), poly(vinyl acetals) modified with anhydrides and amines, hydroxy alkyl cellulose resins, styrene acrylic resins, nitrocellulose, and sulfonated polyesters.

In some embodiments, the plasticizer-containing layer is primarily used as an adhesion layer to facilitate adhesion between the receptor and other layers in the transfer unit. In other embodiments, the plasticizer-containing layer also includes functional materials that facilitate or provide a function to the transferred layer beyond adherence of the transferred portion of the transfer unit to the receptor. Such materials include, for example, dyes (e.g., visible dyes, ultraviolet dyes, IR dyes, fluorescent dyes, and radiation-polarizing dyes); pigments; optically active materials; magnetic particles; electrically conducting, semiconducting, superconducting or insulating particles; liquid crystal materials; phosphors; fluorescent particles; enzymes; electron or hole producing agents; light absorbing particles; reflecting, diffracting, phase retarding, scattering, dispersing, or diffusing particles; and spacer particles.

The plasticizer-containing layer may include a variety of different combinations of materials. As an example, a suitable plasticizer-containing layer includes 15 to 99.5 wt. % binder resin, 0 to 95 wt. % functional material, 0.5 to 70 wt. % plasticizer, and 0 to 50 wt. % dispersing agent and other additives. Plasticizer level is typically about 1 to 40 wt. %. One example of a suitable plasticizer- containing layer for forming, for example, a color filter layer includes 20 to 45 wt. % functional material (e.g., pigment or dye). The remainder of the layer composition is formed using 15 to 79 wt. % binder resin, 1 to 40 wt. % plasticizer, and 0 to 20 wt. % dispersing agent and other additives. Once transferred, the plasticizer and at least one component (typically at least one binder resin and/or dispersing agent) co-react. This co-reaction can be, for example, thermally or photochemically initiated. A catalyst (e.g., a thermal- or photochemical catalyst) or initiator (e.g., a thermal-or photoinitiator that is consumed in the reaction) can be included in the binder composition to facilitate this reaction. In some embodiments, the co-reaction is primarily a polymerization reaction of components of the binder composition in which the plasticizer also participates.

The plasticizer and binder composition can co-react in a variety of ways. For example, in some embodiments, at least a portion of the plasticizer acts as a chain extender, increasing the chain length of the polymeric composition formed by reaction of the components of the binder composition. In some embodiments, at least a portion of the plasticizer crosslinks with components of the binder composition. In some embodiments, at least a portion of the plasticizer is crosslinked to components of the binder composition. The binder composition optionally includes a crosslinking agent to facilitate crosslinking between components of the binder composition and/or between components of the binder composition and the plasticizer. Suitable crosslinking agents include compounds capable of reacting with themselves, other components of the binder composition, and/or the plasticizer to form a three dimensional network.

In some instances, at least a portion of the plasticizer vaporizes during thermal transfer or during the subsequent binding of the plasticizer to the components of the binder composition. Whether a portion of the plasticizer vaporizes or not, at least 50 mol %, and typically at least 65 mol %, of the remaining plasticizer is bound to the binder composition after co-reaction. Preferably, at least 75 mol % or 90 mol % of the remaining plasticizer is bound to the binder composition after co-reaction.

Donor Substrate and Optional Primer Layer

The donor substrate provides a support for the layers of the thermal transfer element. The donor substrate for the thermal transfer element can be a polymer film. One suitable type of polymer film is a polyester film, for example, polyethylene terephthalate or polyethylene naphthalate films. However, other films with sufficient optical properties (if light is used for heating and transfer), including high transmission of light at a particular wavelength, as well as sufficient mechanical and thermal stability for the particular application, can be used. The donor substrate, in at least some instances, is flat so that uniform coatings can be formed. The donor substrate is also typically selected from materials that remain stable despite heating of any layers in the thermal transfer element (e.g., a light-to-heat conversion (LTHC) layer). A suitable thickness for the donor substrate ranges from, for example, 0.025 to 0.15 mm, preferably 0.05 to 0.1 mm, although thicker or thinner donor substrates may be used.

Typically, the materials used to form the donor substrate and the other thermal transfer element layers, particularly, the LTHC layer are selected to improve adhesion between the layers and the donor substrate. An optional priming layer can be used to increase uniformity during the coating of subsequent layers and also increase the interlayer bonding strength between the other layers of the thermal transfer element and the donor substrate. One example of a suitable substrate with primer layer is available from Teijin Ltd. (Product No. HPE100, Osaka, Japan).

Light-to-Heat Conversion (LTHC) Layer

Figure 2:
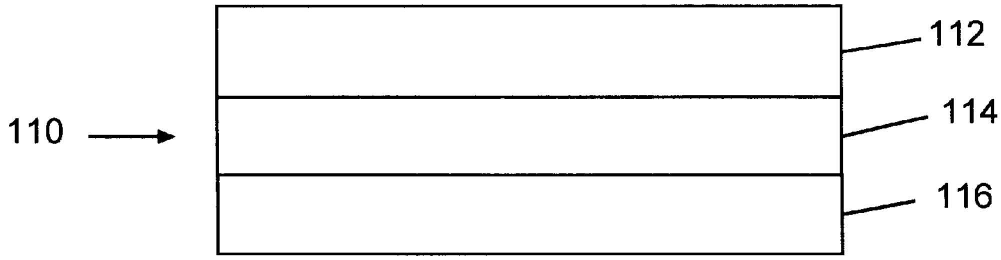
FIG. 2 is a cross-sectional view of a second embodiment of a thermal transfer element containing a transfer unit, according to the invention.

For radiation-induced thermal transfer, a light-to-heat conversion (LTHC) layer is typically incorporated within the thermal transfer element to couple the energy of light radiated from a light-emitting source into the thermal transfer element. FIG. 2 illustrates one embodiment of a thermal transfer element 110 including a donor substrate 112, a light-to-heat conversion layer 114, and a transfer unit 116. Other thermal transfer element structures containing an LTHC layer can be formed.

The LTHC layer typically includes a radiation absorber that absorbs incident radiation (e.g., laser light) and converts at least a portion of the incident radiation into heat to enable transfer of the transfer unit from the thermal transfer element to the receptor. In some embodiments, there is no separate LTHC layer and, instead, the radiation absorber is disposed in another layer of the thermal transfer element, such as the donor substrate, the interlayer, the release layer, or the transfer unit. In other embodiments, the thermal transfer element includes an LTHC layer and also includes additional radiation absorber(s) disposed in one or more of the other layers, of the thermal transfer element, such as, for example, the donor substrate, the release layer, the interlayer, or the transfer unit. In yet other embodiments, the thermal transfer element does not include an LTHC layer or radiation absorber and the transfer unit is transferred using a heating element that contacts the thermal transfer element.

Typically, the radiation absorber in the LTHC layer (or other layers) absorbs light in the infrared, visible, and/or ultraviolet regions of the electromagnetic spectrum. The radiation absorber is typically highly absorptive of the selected imaging radiation, providing an optical density at the wavelength of the imaging radiation in the range of 0.2 to 3, and preferably from 0.5 to 2. Suitable radiation absorbing materials can include, for example, dyes (e.g., visible dyes, ultraviolet dyes, infrared dyes, fluorescent dyes, and radiation-polarizing dyes), pigments, metals, metal compounds, metal films, and other suitable absorbing materials. Examples of suitable radiation absorbers can include carbon black, metal oxides, and metal sulfides. One example of a suitable LTHC layer includes a pigment, such as carbon black, and a binder, such as an organic polymer. Another suitable LTHC layer includes metal or metal/metal oxide formed as a thin film, for example, black aluminum (i.e., a partially oxidized aluminum having a black visual appearance). Metallic and metal compound films can be formed by techniques, such as, for example, sputtering and evaporative deposition. Particulate coatings can be formed using a binder and any suitable dry or wet coating techniques.

Dyes suitable for use as radiation absorbers in a LTHC layer can be present in particulate form, dissolved in a binder material, or at least partially dispersed in a binder material. When dispersed particulate radiation absorbers are used, the particle size can be, at least in some instances, about 10 μm or less, and may be about 1 μm or less. Suitable dyes include those dyes that absorb in the IR region of the spectrum. Examples of such dyes are found in Matsuoka, M., "Infrared Absorbing Materials", Plenum Press, New York, 1990; Matsuoka, M., *Absorption Spectra of Dyes for Diode Lasers*, Bunshin Publishing Co., Tokyo, 1990, U.S. Pat. Nos. 4,722,583; 4,833,124; 4,912,083; 4,942,141; 4,948,776; 4,948,778; 4,950,639; 4,940,640; 4,952,552; 5,023,229; 5,024,990; 5,156,938; 5,286,604; 5,340,699; 5,351,617; 5,560,694; and 5,401,607; European Patent Nos. 321,923 and 568,993; and Beilo, K. A. et al., *J. Chem. Soc., Chem. Commun.,* 1993, 452–454 (1993), all of which are herein incorporated by reference. IR absorbers marketed by Glendale Protective Technologies, Inc., Lakeland, Fla., under the designation CYASORB IR-99, IR-126 and IR-165 may also be used. A specific dye may be chosen based on factors such as, solubility in, and compatibility with, a specific binder and/or coating solvent, as well as the wavelength range of absorption.

Pigmentary materials can also be used in the LTHC layer as radiation absorbers. Examples of suitable pigments include carbon black and graphite, as well as phthalocyanines, nickel dithiolenes, and other pigments described in U.S. Pat. Nos. 5,166,024 and 5,351,617, incorporated herein by reference. Additionally, black azo pigments based on copper or chromium complexes of, for example, pyrazolone yellow, dianisidine red, and nickel azo yellow can be useful. Inorganic pigments can also be used, including, for example, oxides and sulfides of metals such as aluminum, bismuth, tin, indium, zinc, titanium, chromium, molybdenum, tungsten, cobalt, iridium, nickel, palladium, platinum, copper, silver, gold, zirconium, iron, lead, and tellurium. Metal borides, carbides, nitrides, carbonitrides, bronze-structured oxides, and oxides structurally related to the bronze family (e.g., $WO_{2.9}$) can also be used.

Metal radiation absorbers can be used, either in the form of particles, as described for instance in U.S. Pat. No. 4,252,671, incorporated herein by reference, or as films, as disclosed in U.S. Pat. No. 5,256,506, incorporated herein by reference. Suitable metals include, for example, aluminum, bismuth, tin, indium, tellurium and zinc.

As indicated, a particulate radiation absorber can be disposed in a binder. The weight percent of the radiation absorber in the coating, excluding the solvent in the calculation of weight percent, is generally from 1 wt. % to 30 wt. %, typically from 3 wt. % to 20 wt. %, and often from 5 wt. % to 15 wt. %, depending on the particular radiation absorber(s) and binder(s) used in the LTHC.

Suitable binders for use in the LTHC layer include film-forming polymers, such as, for example, phenolic resins (e.g., novolak and resole resins), polyvinyl butyral resins, polyvinyl acetates, polyvinyl acetals, polyvinylidene chlorides, polyacrylates, cellulosic ethers and esters, nitrocelluloses, (meth)acrylate polymers and copolymers, and polycarbonates. Suitable binders can include monomers, oligomers, and/or polymers that have been or can be polymerized or crosslinked. In some embodiments, the binder is primarily formed using a coating of crosslinkable monomers and/or oligomers with optional polymer. When a polymer is used in the binder, the binder generally includes 1 to 50 wt. % polymer and typically includes 10 to 45 wt. %, polymer (excluding the solvent when calculating wt. %).

Upon coating on the donor substrate, the monomers, oligomers, and polymers may be crosslinked to form the LTHC. In some instances, if crosslinking of the LTHC layer is too low, the LTHC layer may be damaged by the heat and/or result in the transfer of a portion of the LTHC layer to the receptor with the transfer unit.

The inclusion of a thermoplastic resin (e.g., polymer) may improve, in at least some instances, the performance (e.g., transfer properties and/or coatability) of the LTHC layer. In one embodiment, the binder includes 25 to 50 wt. % (excluding the solvent when calculating weight percent) thermoplastic resin, and, preferably, 30 to 45 wt. % thermoplastic resin, although lower amounts of thermoplastic resin may be used (e.g., 1 to 15 wt. %). The thermoplastic resin is typically chosen to be compatible (i.e., form a one-phase combination) with the other materials of the binder. A solubility parameter can be used to indicate compatibility, *Polymer Handbook*, J. Brandrup, ed., pp. VII 519–557 (1989), incorporated herein by reference. In at least some embodiments, a thermoplastic resin that has a solubility parameter in the range of 9 to 13 $(cal/cm^3)^{1/2}$, preferably, 9.5 to 12 $(cal/cm^3)^{1/2}$, is chosen for the binder. Examples of suitable thermoplastic resins include (meth)acrylate polymers and copolymers, styrene-acrylic polymers and resins, polyvinyl acetal polymers and copolymers, and polyvinyl butyral.

Conventional coating aids, such as surfactants and dispersing agents, can be added to facilitate the coating process. The LTHC layer can be coated onto the donor substrate using a variety of coating methods known in the art. One example of a suitable thermal transfer element includes a polymeric or organic LTHC layer that is coated to a thickness of 0.05 μm to 20 μm, typically, 0.5 μm to 10 m, and, often 1 μm to 7 μm. Another example of a suitable thermal transfer element includes an inorganic LTHC layer that is coated to a thickness in the range of 0.001 to 10 μm, and typically in the range of 0.002 to 1 μm.

Interlayer

Figure 3:
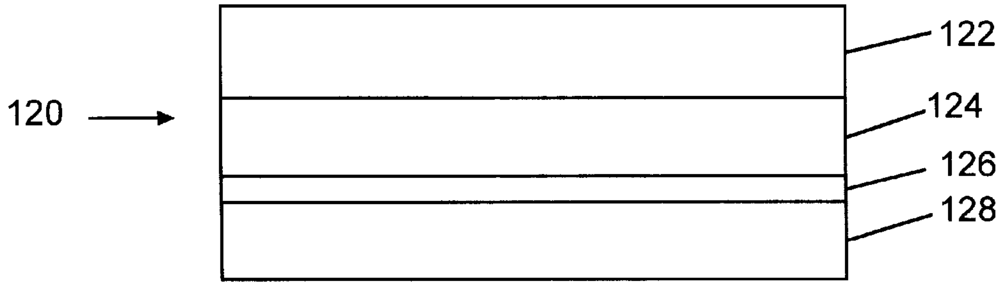
FIG. 3 is a cross-sectional view of a third embodiment of a thermal transfer element containing a transfer unit, according to the invention.

An optional interlayer can be used in the thermal transfer element to minimize damage and contamination of the transferred portion of the transfer unit and/or reduce distortion in the transferred portion of the transfer unit. The interlayer may also influence the adhesion of the transfer layer to the rest of the thermal transfer element. FIG. 3 illustrates one embodiment of a thermal transfer element 120 including a donor substrate 122, a light-to-heat conversion layer 124, an interlayer 126, and a transfer unit 128. Other thermal transfer elements including an interlayer can be formed. The interlayer can be transmissive, reflecting, and/or absorbing at the imaging wavelength. Typically, the interlayer has high thermal resistance. Preferably, the interlayer does not distort or chemically decompose under the imaging conditions, particularly to an extent that renders the transferred portion of the transfer unit non-functional. The interlayer typically remains in contact with the LTHC layer during the transfer process and is not substantially transferred with the transfer unit.

Suitable interlayers include, for example, polymer films, metal layers (e.g., vapor deposited metal layers), inorganic layers (e.g., sol-gel deposited layers and vapor deposited layers of inorganic oxides (e.g., silica, titania, and other metal oxides)), and organic/inorganic composite layers. Organic materials suitable as interlayer materials include both thermoset and thermoplastic materials. Suitable thermoset materials include resins that may be crosslinked by heat, radiation, or chemical treatment including, but not limited to, crosslinked or crosslinkable polyacrylates, polymethacrylates, polyesters, epoxies, and polyurethanes. The thermoset materials may be coated onto the LTHC layer as, for example, thermoplastic precursors and subsequently crosslinked to form a crosslinked interlayer.

Suitable thermoplastic materials include, for example, polyacrylates, polymethacrylates, polystyrenes, polyurethanes, polysulfones, polyesters, and polyimides. These thermoplastic organic materials may be applied via conventional coating techniques (for example, solvent coating, spray coating, or extrusion coating). Typically, the glass transition temperature ($T_g$) of thermoplastic materials suitable for use in the interlayer is 25° C. or greater, preferably 50° C. or greater, more preferably 100° C. or greater, and, most preferably, 150° C. or greater. The interlayer can be transmissive, absorbing, reflective, or some combination thereof, at the imaging radiation wavelength.

Inorganic materials suitable as interlayer materials include, for example, metals, metal oxides, metal sulfides, and inorganic carbon coatings, including those materials that are highly transmissive or reflective at the imaging light wavelength. These materials can be applied to the light-to-heat-conversion layer via conventional techniques (e.g., vacuum sputtering, vacuum evaporation, or plasma jet deposition).

The interlayer can provide a number of benefits. The interlayer may be a barrier against the transfer of material from the light-to-heat conversion layer. It may also modulate the temperature attained in the transfer unit so that thermally unstable materials can be transferred. The presence of an interlayer may also result in improved plastic memory in the transferred material.

The interlayer can contain additives, including, for example, photoinitiators, surfactants, pigments, plasticizers, radiation absorbers, and coating aids. The thickness of the interlayer depends on factors such as, for example, the material of the interlayer, the material of the LTHC layer, the material of the transfer layer, the wavelength of the imaging radiation, and the duration of exposure of the thermal transfer element to imaging radiation. For polymer interlayers, the thickness of the interlayer is, for example, in the range of 0.05 μm to 10 μm, generally, from about 0.1 μm to 4 μm, typically, 0.5 to 3 μm, and, often, 0.8 to 2 μm.. For inorganic interlayers (e.g., metal or metal compound interlayers), the thickness of the interlayer is, for example, in the range of 0.005 μm to 10 μm, typically, from about 0.01 μm to 3 μm, and, often, from about 0.02 to 1 μm.

Release Layer

Figure 4:
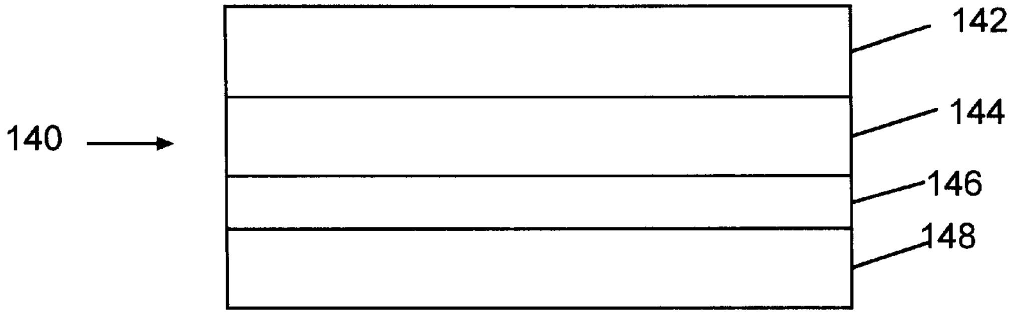
FIG. 4 is a cross-sectional view of a fourth embodiment of a thermal transfer element containing a transfer unit, according to the invention.

The optional release layer typically facilitates release of the transfer unit (e.g., the plasticizer-containing layer) from the rest of the thermal transfer element (e.g., the donor substrate, the interlayer and/or the LTHC layer) upon heating of the thermal transfer element, for example, by a light-emitting source or a heating element. In at least some cases, the release layer provides some adhesion of the transfer layer to the rest of the thermal transfer element prior to exposure to heat. FIG. 4 illustrates a thermal transfer element 140 including a donor substrate 142, a light-to-heat conversion layer 144, a release layer 146, and a transfer unit 148. Other combinations of layers may also be used.

Suitable release layers include, for example, thermoplastic and thermoset polymers. Examples of suitable polymers include acrylic polymers, polyanilines, polythiophenes, poly(phenylenevinylenes), polyacetylenes, phenolic resins (e.g., novolak and resole resins), polyvinyl butyral resins, polyvinyl acetates, polyvinyl acetals, polyvinylidene chlorides, polyacrylates, cellulosic ethers and esters, nitrocelluloses, epoxy resins, and polycarbonates. Other suitable materials for the release layer include sublimable materials (such as phthalocyanines), including, for example, the materials described in U.S. Pat. No. 5,747,217, incorporated herein by reference.

The release layer can be part of the transfer unit or a separate layer that does not transfer. All or a portion of the release layer can be transferred with the transfer unit. Alternatively, most or substantially all of the release layer remains with the donor substrate when the transfer unit is transferred. In some instances, for example, with a release layer including sublimable material, a portion of the release layer may be dissipated during the transfer process. In some embodiments, a portion of the release layer does transfer with the transfer unit and the release layer is formed of a material that can be removed by, for example, heating to sublimate, vaporize, or liquefy the transferred portion of the release layer.

Thermal Transfer

The thermal transfer element can be heated by application of directed heat on a selected portion of the thermal transfer element. Heat can be generated using a heating element (e.g., a resistive heating element), converting radiation (e.g., a beam of light) to heat, and/or applying an electrical current to a layer of the thermal transfer element to generate heat. In many instances, thermal transfer using light from, for example, a lamp or laser, is advantageous because of the accuracy and precision that can often be achieved. The size and shape of the transferred pattern (e.g., a line, circle, square, or other shape) can be controlled by, for example, selecting the size of the light beam, the exposure pattern of the light beam, the duration of directed beam contact with the thermal transfer element, and the materials of the thermal transfer element.

For thermal transfer using radiation (e.g., light), a variety of radiation-emitting sources can be used in the present invention. For analog techniques (e.g., exposure through a mask), high-powered light sources (e.g., xenon flash lamps and lasers) are useful. For digital imaging techniques, infrared, visible, and ultraviolet lasers are particularly useful. Suitable lasers include, for example, high power (≧100 mW) single mode laser diodes, fiber-coupled laser diodes, and diode-pumped solid state lasers (e.g., Nd:YAG and Nd:YLF). Laser exposure dwell times can be in the range from, for example, about 0.1 to 5 microseconds and laser fluences can be in the range from, for example, about 0.01 to about 1 J/cm$^2$.

When high spot placement accuracy is required (e.g. for high information full color display applications) over large substrate areas, a laser is particularly useful as the radiation source. Laser sources are compatible with both large rigid substrates such as 1m×1m×1.1 mm glass, and continuous or sheeted film substrates, such as 100 $\mu$m polyimide sheets.

Resistive thermal print heads or arrays can be used, for example, with simplified donor film constructions lacking a LTHC layer and radiation absorber. This may be particularly useful with smaller substrate sizes (e.g., less than approximately 30 cm in any dimension) or for larger patterns, such as those required for alphanumeric segmented displays.

During imaging, the thermal transfer element is typically brought into intimate contact with a receptor. In at least some instances, pressure or vacuum is used to hold the thermal transfer element in intimate contact with the receptor. A radiation source is then used to heat the LTHC layer (and/or other layer(s) containing radiation absorber) in an imagewise fashion (e.g., digitally or by analog exposure through a mask) to perform imagewise transfer of the transfer layer from the thermal transfer element to the receptor according to a pattern.

Alternatively, a heating element, such as a resistive heating element, can be used to transfer the transfer unit. The thermal transfer element is selectively contacted with the heating element to cause thermal transfer of a portion of the transfer layer according to a pattern. In another embodiment, the thermal transfer element includes a layer that can convert an electrical current applied to the layer into heat.

Typically, the transfer unit is transferred to the receptor without transferring other layers of the thermal transfer element, such as the optional interlayer or the LTHC layer. The presence of the optional interlayer may eliminate or reduce the transfer of the LTHC layer to the receptor and/or reduce distortion in the transferred portion of the transfer layer. Preferably, under imaging conditions, the adhesion of the interlayer to the LTHC layer is greater than the adhesion of the interlayer to the transfer layer. In some instances, a reflective interlayer is used to attenuate the level of imaging radiation transmitted through the interlayer and reduce any damage to the transferred portion of the transfer layer that may result from interaction of the transmitted radiation with the transfer layer and/or the receptor. This is particularly beneficial in reducing thermal damage which may occur when the receptor is highly absorptive of the imaging radiation.

During laser exposure, it may be desirable to minimize formation of interference patterns due to multiple reflections from the imaged material. This can be accomplished by various methods. The most common method is to effectively roughen the surface of the thermal transfer element on the scale of the incident radiation as described in U.S. Pat. No. 5,089,372. This has the effect of disrupting the spatial coherence of the incident radiation, thus minimizing self-interference. An alternate method is to employ an anti-reflection coating within the thermal transfer element. The use of anti-reflection coatings is known, and can consist of quarter-wave thicknesses of a coating such as magnesium fluoride, as described in U.S. Pat. No. 5,171,650, incorporated herein by reference.

Large thermal transfer elements can be used, including thermal transfer elements that have length and width dimensions of a meter or more. In operation, a laser can be rastered or otherwise moved across the large thermal transfer element, the laser being selectively operated to illuminate portions of the thermal transfer element according to a desired pattern. Alternatively, the laser can be stationary and the thermal transfer element moved beneath the laser.

In some instances, it may be necessary, desirable, and/or convenient to sequentially utilize two or more different thermal transfer elements to form a device, article, or structure. Each of these thermal transfer elements includes a transfer unit to transfer one or more layers to the receptor. The two or more thermal transfer units are then sequentially used to deposit one or more layers of the device, article, or structure.

EXAMPLES

Example 1 Preparation of a Thermal Transfer Element

A light-to-heat conversion layer was prepared by making a LTHC Coating Solution with the solid components of Table 1 in a 60%/40% solution of propylene glycol methyl ether acetate/methyl ethyl ketone with 30% solids. The LTHC Coating Solution was coated onto a 0.1 mm PET substrate.

TABLE 1

LTHC Coating Solids

| Component | Parts by Weight |
|---|---|
| Raven ™ 760 Ultra carbon black pigment (available from Columbian Chemicals, Atlanta, GA) | 100 |
| Butvar ™ B-98 (polyvinylbutyral resin, available from Monsanto, St. Louis, MO) | 17.9 |
| Joncryl ™ 67 (acrylic resin, available from S.C. Johnson & Son, Racine, WI) | 53.5 |
| Elvacite ™ 2669 (acrylic resin, available from ICI Acrylics, Wilmington, DE) | 556 |
| Disperbyk ™ 161 (dispersing aid, available from Byk Chemie, Wallingford, CT) | 8.9 |
| Ebecryl ™ 629 (epoxy novolac acrylate, available from UCB Radcure, N. Augusta, SC) | 834 |
| Irgacure ™ 369 (photocuring agent, available from Ciba Specialty Chemicals, Tarrytown, NY) | 45.2 |
| Irgacure ™ 184 (photocuring agent, available from Ciba Specialty Chemicals, Tarrytown, NY) | 6.7 |

The coating was dried and UV-cured. The dried coating had a thickness of approximately 4 to 6 micrometers.

Onto the light-to-heat conversion layer was coated an Interlayer Coating Solution, according to Table 2 (in a 90 wt. %/10 wt. % solution of isopropyl alcohol/methyl ethyl ketone with 9.3 wt. % solids). This coating was dried and UV-cured. The thickness of the resulting interlayer coating was approximately 1 to 1.5 micrometers.

TABLE 2

| Interlayer Coating Solids | |
|---|---|
| Component | Parts by Weight |
| Butvar ™ B-98 | 4.76 |
| Joncryl ™ 67 | 14.29 |
| Sartomer ™ SR351 ™ (trimethylolpropane triacrylate, available from Sartomer, Exton, PA) | 79.45 |
| Irgacure ™ 369 | 4.5 |
| Fluorescent Dye | 1.12 |

Onto the interlayer was coated a Transfer Coating Solution, according to Table 3 (in a 80 wt. %/20 wt. % solution of propylene glycol methyl ether acetate/cyclohexanone with 15 wt. % solids). This coating was dried and UV-cured. The thickness of the resulting transfer coating was approximately 1 to 2 micrometers.

TABLE 3

| Transfer Coating Solids | |
|---|---|
| Component | Parts by Weight |
| Monastral ™ Green 6Y-CL Pigment (Zeneca, Charlotte, NC) | 70 |
| E4GN Yellow Pigment (Bayer AG, Leverkusen Germany) | 30 |
| Disperbyk ™ 161 (dispersing aid, available from Byk Chemie, Wallingford, CT) | 18 |
| G-Cryl 6005 (resin, available from Henkel Corp., Cincinnati, OH) | 102.5 |
| Epon SU-8 (crosslinker, available from Shell Chemical Co., Houston, TX) | 11.4 |
| S510 (methacryloyloxy ethyl phosphate available from Daiichi Kougyou Seiyakyu, Japan) | 1.12 |

EXAMPLE 2

Preparation of a Thermal Transfer Element

Another thermal transfer element was formed using the same layers and procedures as in Example 1, except that the plasticizer PM-2 (di(methacryloyloxy ethyl) phosphate, Nihon Kayaku, Japan) was used instead of S510.

COMPARATIVE EXAMPLE

Preparation of a Comparative Thermal Transfer Element

A comparative thermal transfer element was formed using the same layers and procedures as in Example 1 except that the amount (1.12 parts) of plasticizer S510 was replaced with G-Cryl 6005 and Epon SU-8 in the same relative proportions found in Table 3.

EXAMPLE 3

Thermal Transfer Using the Thermal Transfer Elements of Examples 1 and 2 and the Comparative Example Each of the thermal transfer elements of Examples 1 and 2 and the Comparative Example were imaged onto a glass substrate. The beams from two10W, single mode Nd:Vao3 lasers, operating at a wavelength of 1053 nm were combined, and scanned using a linear galvonometer (Cambridge Instruments). The beams were focused onto the media through an f-theta lens system, to a laser spot size at the image plane of 30 μm×420 μm, (measured at the $1/e^2$ intensity points). The combined beams were scanned at a linear scan speed of 10.5 meters/second, in the direction of the major axis of the focused laser spot. At the same time the beam was scanned in the linear direction, the position of the beam perpendicular to the scan direction was modulated using an acousto-optic deflector. The amplitude of the modulation was approximately 120 μm, and the frequency of the modulation was 200 kHz.

Linewidth of the transferred lines was measured with results provided in Table 4. Edge roughness of the transferred lines was compared by determining the standard of the line width using linewidth measurements at 0.2 μm intervals along the line. These results are also provided in Table 4. The results show that the addition of the co-reactive plasticizer increased the transferred line width and resulted in less edge roughness.

TABLE 4

| Line Width and Edge Roughness | | |
|---|---|---|
| | Line Width (μm) | Edge Roughness (μm) |
| Example 1 | 80.7 | 0.568 |
| Example 2 | 77.6 | 0.544 |
| Comparative Example | 75.8 | 0.784 |

The present invention should not be considered limited to the particular examples described above, but rather should be understood to cover all aspects of the invention as fairly set out in the attached claims. Various modifications, equivalent processes, as well as numerous structures to which the present invention may be applicable will be readily apparent to those of skill in the art to which the present invention is directed upon review of the instant specification.

What is claimed is:

1. A method of making an article, the method comprising steps of:

contacting a receptor with a thermal transfer element comprising a transfer unit, the transfer unit comprising at least one layer having a binder composition and a plasticizer comprising a phosphate compound;

thermally transferring a portion of the transfer unit from the thermal transfer element to the receptor; and reactively coupling the binder composition and the plasticizer in the portion of the transfer unit transferred to the receptor.

2. The method of claim 1, wherein the step of contacting a receptor comprises contacting the receptor with the thermal transfer element, wherein the plasticizer has a glass transition temperature of no more than 25° C.

3. The method of claim 1, wherein the step of contacting a receptor comprises contacting the receptor with the thermal transfer element, wherein the layer comprising the binder composition and the plasticizer has a glass transition temperature of that is at least 40° C. less than a same layer without the plasticizer.

4. The method of claim 1, wherein the step of reactively coupling the binder composition and the plasticizer comprises co-reacting the binder composition and the plasticizer to form a polymeric composition.

5. The method of claim 1, wherein the step of reactively coupling the binder composition and the plasticizer comprises crosslinking the plasticizer and the binder composition.

6. The method of claim 5, wherein the step of crosslinking the plasticizer and the binder composition comprises crosslinking the plasticizer and the binder composition, wherein the binder composition comprises a crosslinking agent.

7. The method of claim 1, wherein the step of reactively coupling the binder composition and the plasticizer comprises photochemically reacting the binder composition and the plasticizer.

8. The method of claim 7, wherein the step of photochemically reacting the binder composition and the plasticizer comprises photochemically reacting the binder composition and the plasticizer, wherein the binder composition comprises a compound selected from the group consisting of photocatalysts and photoinitiators.

9. The method of claim 1, wherein the binder composition comprises a binder resin.

10. The method of claim 1, wherein the binder composition comprises a dispersing agent.

11. The method of claim 1, wherein the step of thermally transferring a portion of the transfer unit comprises selectively irradiating the thermal transfer element with light, wherein the thermal transfer element comprises a light-to-heat conversion layer to generate heat in response to irradiation.

12. The method of claim 1, wherein the method further comprises forming an electronic display using the transferred layer as at least a portion of a component of the electronic display.

13. The method of claim 12, wherein the step of forming an electronic display comprises forming an electronic display using the transferred layer as at least a portion of a component selected from the group consisting of color filter, black matrix, and spacer.

14. A thermal transfer element comprising:

a substrate; and a transfer unit including at least one layer comprising a binder composition and a plasticizer comprising a phosphate compound, wherein the thermal transfer element is configured and arranged so that the binder composition and the plasticizer are capable of co-reacting after transfer of a portion of the transfer unit to a receptor.

15. The thermal transfer element of claim 14, wherein the plasticizer has a glass transition temperature that is no more than 25° C.

16. The thermal transfer element of claim 14, wherein the layer comprising the binder composition and the plasticizer has a glass transition temperature that is at least 40° C. less than a glass transition temperature of a same layer without the plasticizer.

17. The thermal transfer element of claim 14, wherein the binder composition comprises a binder resin.

18. The thermal transfer element of claim 14, wherein the binder composition comprises a compound selected from the group consisting of photocatalysts and photoinitiators to photochemically co-react the binder composition and the plasticizer.

19. The thermal transfer element of claim 14, wherein the binder composition comprises a crosslinking agent.

20. The thermal transfer element of claim 14, wherein the plasticizer comprises a compound having a reactive functional group selected from the group consisting of epoxide, carboxylic acid, hydroxyl, ethylenic-unsaturated, vinyl, acrylic, methacrylic, amino, ester, mercapto, labile halo, imino, carbonyl, sulfonic acid, and sulfonic ester functional groups and any functional group that is capable of participating in a Diels-Alder reaction.

21. The thermal transfer element of claim 14, wherein the plasticizer comprises a (meth)acryloyloxyalkyl phosphate.

22. The thermal transfer element of claim 14, further comprising a light-to-heat converter disposed between the substrate and the transfer unit.

23. The thermal transfer element of claim 22, further comprising an interlayer between the light-to-heat conversion layer and the transfer unit.

24. The thermal transfer element of claim 14, wherein the thermal transfer element is configured and arranged for formation of at least a portion of a component of an electronic display.

25. The thermal transfer element of claim 24, wherein the component of the electronic display is selected from the group consisting of color filter, black matrix, and spacer.

26. An article comprising:

a substrate; and a thermally transferred layer comprising a binder composition and a plasticizer that have been co-reacted subsequent to transfer of the thermally transferred layer from a thermal transfer element, wherein the plasticizer comprises a phosphate compound.

27. The article of claim 26, wherein the binder composition and plasticizer have been crosslinked subsequent to transfer of the thermally transferred layer from the thermal transfer element.

28. The article of claim 26, wherein the article is an electronic display and the substrate is a display substrate.

29. The method of claim 1, wherein the plasticizer comprises a (meth)acryloyloxyalkyl phosphate.

30. The article of claim 26, wherein the plasticizer comprises a (meth)acryloyloxyalkyl phosphate.

* * * * *

UNITED STATES PATENT AND TRADEMARK OFFICE

CERTIFICATE OF CORRECTION

PATENT NO. : 6,228,543 B1
DATED : May 8, 2001
INVENTOR(S) : Kazuhiko Mizuno et al.

It is certified that error appears in the above-identified patent and that said Letters Patent is hereby corrected as shown below:

Column 14,
Line 8, please add the word -- deviation -- before the word "standard"

Signed and Sealed this

Twenty-sixth Day of February, 2002

*Attest:*

JAMES E. ROGAN
*Director of the United States Patent and Trademark Office*

*Attesting Officer*